(12) United States Patent
Shih et al.

(10) Patent No.: US 11,940,727 B2
(45) Date of Patent: Mar. 26, 2024

(54) RETICLE ENCLOSURE FOR LITHOGRAPHY SYSTEMS

(71) Applicant: TAIWAN SEMICONDUCTOR MANUFACTURING COMPANY, LTD., Hsinchu (TW)

(72) Inventors: Chih-Tsung Shih, Hsinchu (TW); Tsung-Chih Chien, Caotun Township (TW); Tsung Chuan Lee, Taipei (TW); Hao-Shiang Chang, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 18/126,898

(22) Filed: Mar. 27, 2023

(65) Prior Publication Data

US 2023/0236498 A1  Jul. 27, 2023

Related U.S. Application Data

(63) Continuation of application No. 17/870,108, filed on Jul. 21, 2022, now Pat. No. 11,614,683, which is a
(Continued)

(51) Int. Cl.
*G03F 7/20* (2006.01)
*G03F 1/66* (2012.01)
(Continued)

(52) U.S. Cl.
CPC ............ *G03F 1/66* (2013.01); *H01L 21/0274* (2013.01); *H01L 21/67359* (2013.01); *G03F 7/70741* (2013.01)

(58) Field of Classification Search
CPC ... G03F 1/66; G03F 7/70741; H01L 21/0274; H01L 21/67359; H01L 21/67353
See application file for complete search history.

(56) References Cited

U.S. PATENT DOCUMENTS 8,796,666 B1  8/2014  Huang et al.
9,093,530 B2  7/2015  Huang et al.
(Continued)

OTHER PUBLICATIONS

Non-Final Office Action issued in U.S. Appl. No. 17/193,236, dated Oct. 4, 2021.
(Continued)

*Primary Examiner* — Mesfin T Asfaw
(74) *Attorney, Agent, or Firm* — STUDEBAKER & BRACKETT PC

(57) ABSTRACT

A reticle enclosure includes a base including a first surface, a cover including a second surface and coupled to the base with the first surface facing the second surface. The base and the cover form an internal space that includes a reticle. The reticle enclosure includes restraining mechanisms arranged in the internal space and for securing the reticle, and structures disposed adjacent the reticle in the internal space. The structures enclose the reticle at least partially, and limit passage of contaminants between the internal space and an external environment of the reticle enclosure. The structures include barriers disposed on the first and second surfaces. In other examples, a padding is installed in gaps between the barriers and the first and second surfaces. In other examples, the structures include wall structures disposed on the first and second surfaces and between the restraining mechanisms.

20 Claims, 9 Drawing Sheets

Related U.S. Application Data continuation of application No. 17/193,236, filed on Mar. 5, 2021, now Pat. No. 11,415,879.

(51) Int. Cl.
*H01L 21/027* (2006.01)
*H01L 21/673* (2006.01)
*G03F 7/00* (2006.01)

(56) References Cited

U.S. PATENT DOCUMENTS

| | | |
|---|---|---|
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 2005/0286029 A1 | 12/2005 | Ham et al. |
| 2006/0260978 A1 | 11/2006 | Gregerson et al. |

OTHER PUBLICATIONS

Notice of Allowance issued in U.S. Appl. No. 17/193,236, dated Apr. 13, 2022.
Notice of Allowance issued in U.S. Appl. No. 17/870,108, dated Nov. 30, 2022.

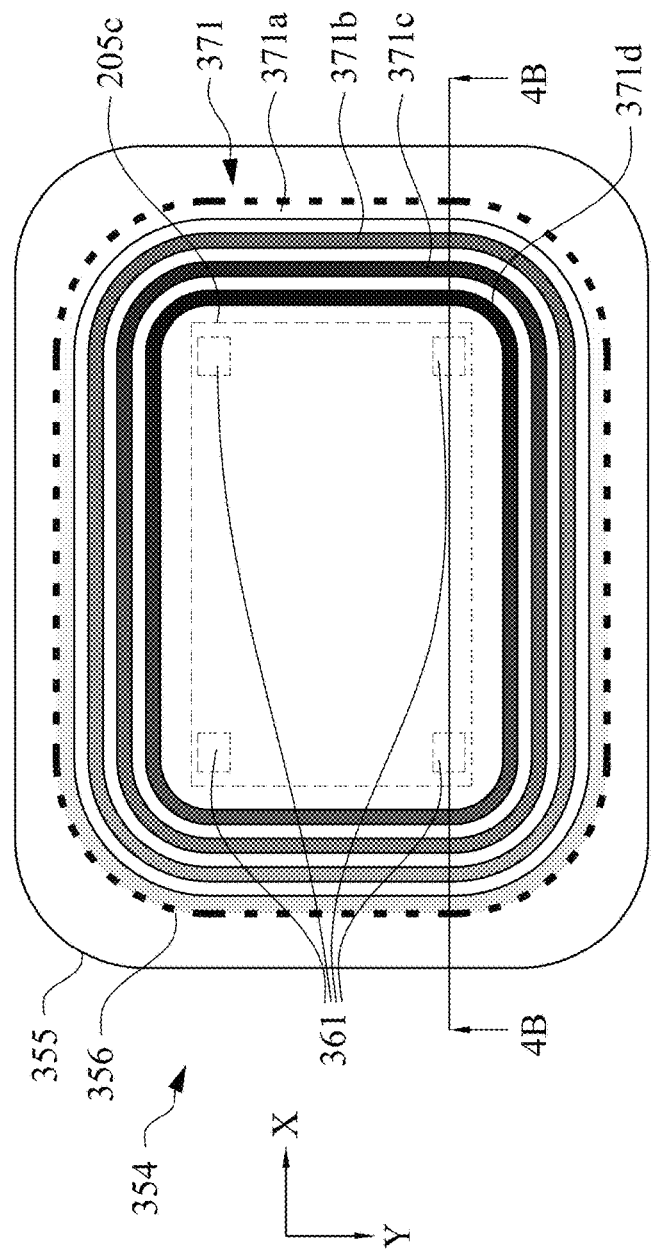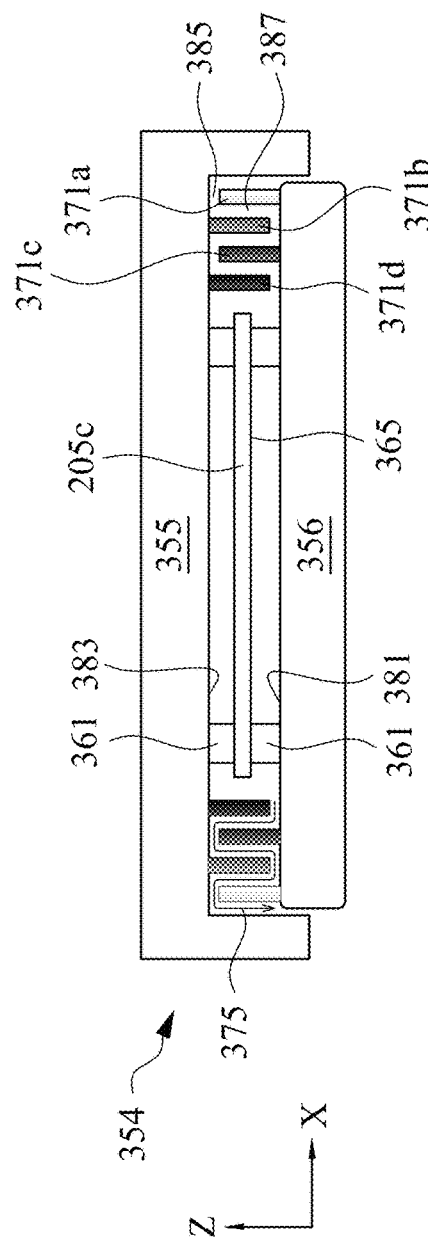
FIG. 4A
FIG. 4B

RETICLE ENCLOSURE FOR LITHOGRAPHY SYSTEMS

CROSS-REFERENCE TO RELATED APPLICATIONS

This application is a continuation application of U.S. non-provisional patent application Ser. No. 17/870,108 filed on Jul. 21, 2022, now U.S. Pat. No. 11,614,683, which is a continuation application of U.S. non-provisional patent application Ser. No. 17/193,236 filed on Mar. 5, 2021, now U.S. Pat. No. 11,415,879, the entire contents of both these applications are incorporated herein by reference.

BACKGROUND

A lithographic apparatus projects a pattern from a patterning device (e.g., a photo mask) onto a layer of radiation-sensitive material (resist) provided on the semiconductor substrate. When a photo mask is not used (stored) or transferred from a storage to an lithography apparatus, such as a stepper or a scanner, the photo mask is appropriately protected from contamination such as dust or particles by being placed in a mask case (pod).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a plan view of the EUV Inner Pod (EIP) in FIG. 3 including the reticle, according to embodiments.

FIG. 4B is a cross-sectional view of the EUV Inner Pod (EIP) in FIG. 4A.

DETAILED DESCRIPTION

Figure 1A:
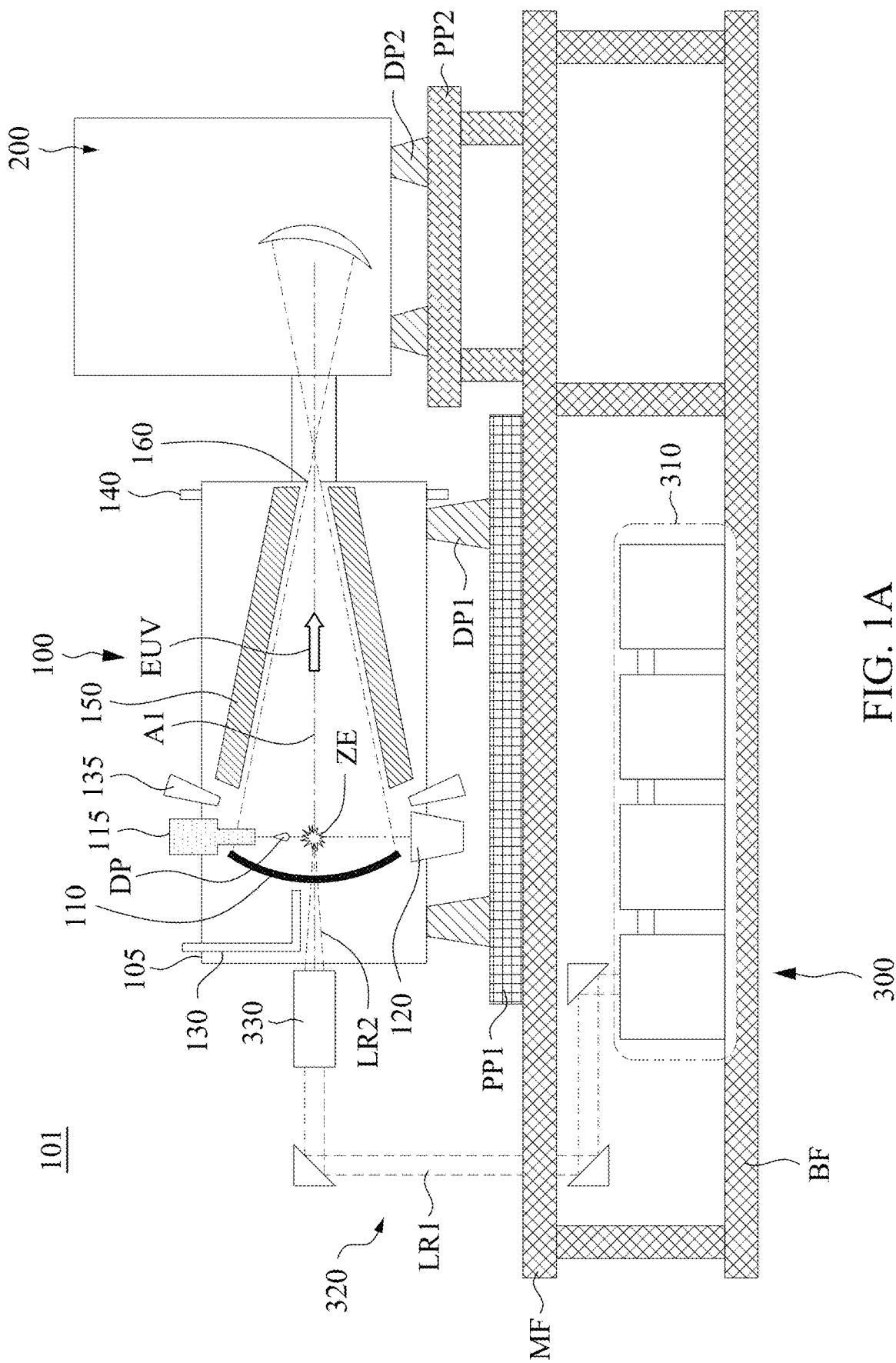
FIG. 1A is a schematic view of an extreme ultraviolet (EUV) lithography system with a laser produced plasma (LPP) EUV radiation source, constructed in accordance with some embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

The present disclosure is generally related to extreme ultraviolet (EUV) lithography system and methods. Embodiments disclosed herein are directed to an improved extreme ultraviolet (EUV) mask pod design, and more specifically, to an EUV mask pod design for reducing exposure of a photo mask (reticle) contained therein to external particulate matter (i.e., dust, dirt, etc.) from outside the pod, and for limiting the contamination of the extreme ultraviolet lithography system (e.g., of the exposure tool) by pieces of pellicle released due to rupture of the pellicle installed on the reticle.

The need for protection from particulate matter (i.e., dust, dirt, etc.) contaminating objects of interest is required in many fields of application, including applications in semiconductor manufacturing such as extreme ultraviolet lithography. A lithographic apparatus projects a pattern from a patterning device (e.g., a photo mask) onto a layer of radiation-sensitive material (resist) provided on the semiconductor substrate. The wavelength of radiation used by a lithographic apparatus to project a pattern onto a substrate determines the minimum size of features that can be formed on that substrate. A lithographic apparatus that uses extreme ultraviolet radiation, being electromagnetic radiation having a wavelength within the range 4-20 nm, may be used to form smaller features on a substrate than a conventional lithographic apparatus (which may for example use electromagnetic radiation with a wavelength of 193 nm).

The patterning device (photo mask or reticle) is protected from particle contamination by a pellicle. The pellicle is located away from the patterning device and is out of the focal plane of a lithographic apparatus in use. Because the pellicle is out of the focal plane of the lithographic apparatus, contamination particles which land on the pellicle are out of focus in the lithographic apparatus. Consequently, images of the contamination particles are not projected onto the substrate. If the pellicle were not present, then a contamination particle which landed on the patterning device would be projected onto the substrate and would introduce a defect into the projected pattern.

While the pellicle limits contaminants from reaching the printed or patterned surface of reticle, contaminants can still enter the EUV mask pod from the space between the base and cover of the EUV mask pod. In addition, particle generated due to pellicle rupture may travel out of the EUV mask pod and be dispersed in the lithography system. The particles contaminate the environment of the lithography system and introduce defects into the pattern projected on the semiconductor substrate. It is desirable to limit particles from entering the EUV mask pod and for particles to exit the EUV mask pod. It should be noted that, although embodiments are discussed herein with reference to EUV lithography systems, embodiments are not limited in this regard. The mask pod, according to embodiments discussed herein, can be used in other types of lithography systems (e.g., deep ultraviolet (DUV) lithography systems), without departing from the scope of the disclosure.

FIG. 1A is a schematic and diagrammatic view of an EUV lithography system 101. The EUV lithography system 101 includes an EUV radiation source apparatus 100 to generate EUV light, an exposure tool 200, such as a scanner, and an excitation laser source apparatus 300. As shown in FIG. 1A, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

Figure 1B:
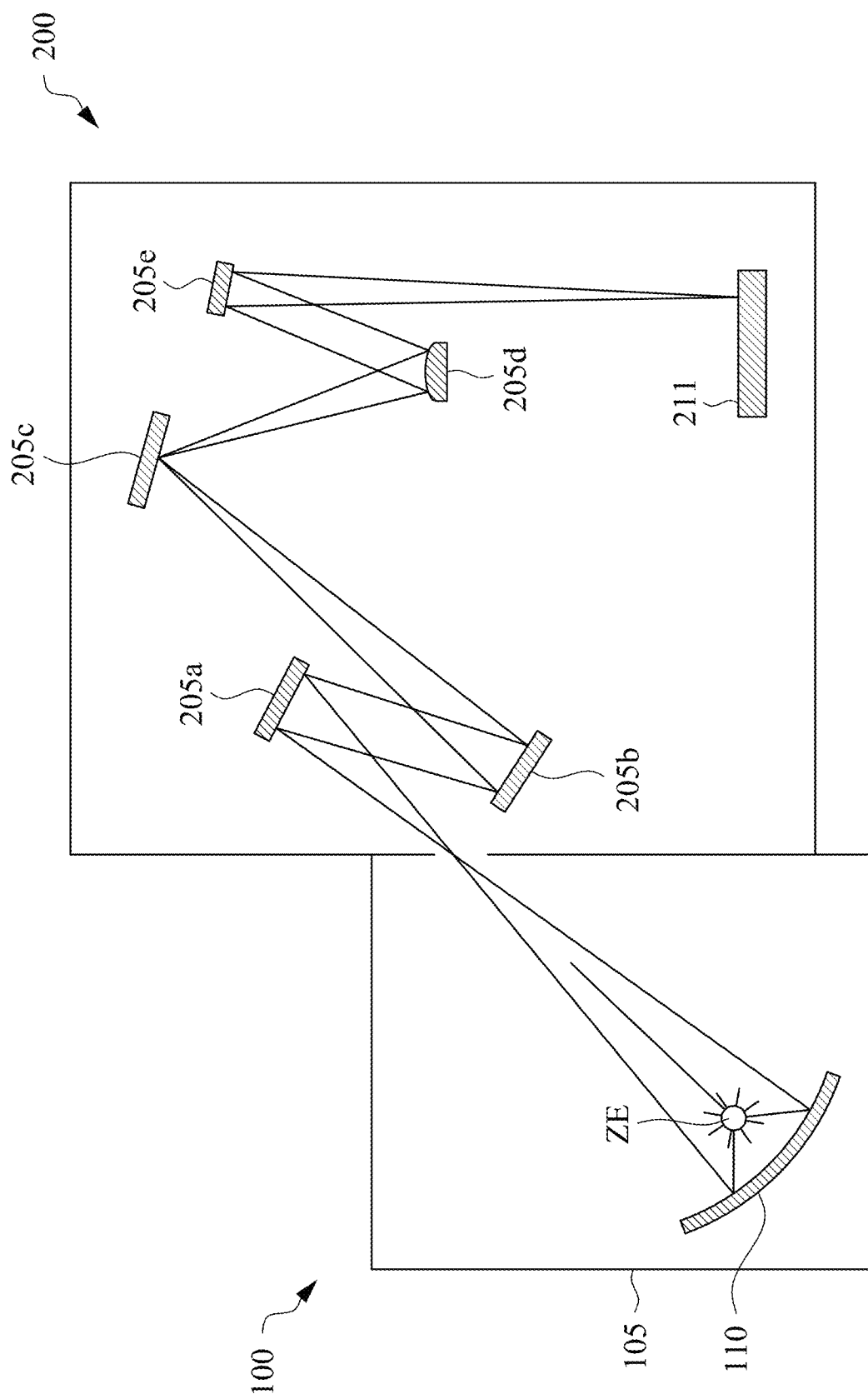
FIG. 1B is a schematic view of an EUV lithography system exposure tool according to embodiments of the disclosure.

FIG. 1B is a simplified schematic diagram of the exposure tool 200 according to an embodiment of the disclosure showing the exposure of photoresist coated substrate 211 with a patterned beam of EUV light. The exposure tool 200 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle 205c, with a beam of EUV light, to produce a patterned beam, and one or more reduction projection optics 205d, 205e, for projecting the patterned beam onto the substrate 211. The one or more optics 205a, 205b provide the beam of EUV light with a desired cross-sectional shape and a desired angular distribution. The reticle 205c is protected by a pellicle, which is held in place by a pellicle frame. The reticle 205c reflects and patterns the beam of EUV light.

Figure 1C:
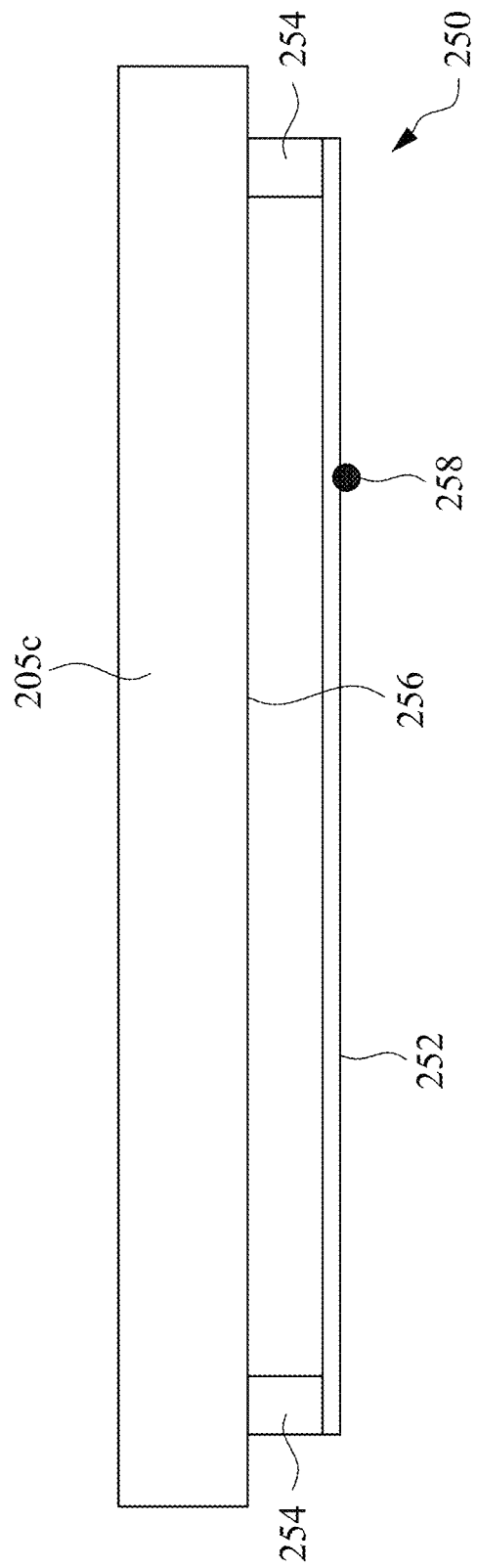
FIG. 1C illustrates a schematic pellicle assembly installed on a reticle placed in the EUV lithography system of FIG. 1A.

Referring briefly to FIG. 1C, illustrated is a schematic pellicle assembly 250 installed on the reticle 205c in relative detail. The pellicle assembly 250 includes a pellicle 252 and the pellicle frame 254. The reticle 205c has a patterned surface 256. The pellicle frame 254 supports the pellicle 252 around a perimeter portion of the pellicle 252 and is removably attachable to the reticle 205c.

The pellicle 252 holds a contaminant, e.g., contamination particle 258, at a distance from the patterned surface 256 of the reticle 205c such that the contamination particle 258 is not in the focal plane of the beam of EUV radiation and is thus not imaged onto the substrate 211 (FIG. 1B).

Returning to FIG. 1B, following reflection from the reticle the patterned beam of EUV light is provided to the one or more optics 205a, 205b and is in turn projected onto the substrate 211 held by a mechanical assembly (e.g., substrate table). In some embodiments, the one or more optics 205a, 205b apply a reduction factor to the radiation beam, forming an image with features that are smaller than corresponding features on the reticle. The mechanical assembly may be provided for generating a controlled relative movement between the substrate 211 and reticle 205c.

The EUV lithography system may, for example, be used in a scan mode, wherein the chuck and the mechanical assembly (e.g., substrate table) are scanned synchronously while a pattern imparted to the radiation beam is projected onto the substrate 211 (i.e. a dynamic exposure). The velocity and direction of the substrate table relative to the chuck is determined by the demagnification and image reversal characteristics of the exposure tool 200. The patterned beam of EUV radiation that is incident upon the substrate 211 comprises a band of radiation. The band of radiation is referred to as an exposure slit. During a scanning exposure, the movement of the substrate table and the chuck is such that the exposure slit travels over an exposure field of the substrate 211. As further shown in FIG. 1B, the EUVL tool includes an EUV radiation source 100 including plasma at ZE emitting EUV light in a chamber 105 that is collected and reflected by a collector 110 along a path into the exposure tool 200 to irradiate the substrate 211.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes TiO2 doped SiO2, or other suitable materials with low thermal expansion. The mask includes multiple reflective multiple layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules. As shown in FIG. 1A, the EUV radiation source 100 includes a target droplet generator 115 and a LPP collector 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 μm or less, and the main laser pulses have a spot size about 200-300 μm.

The laser pulses LR2 are generated by the excitation laser source 300. The laser source 300 may include a laser generator 310, laser guide optics 320 and a focusing apparatus 330. In some embodiments, the laser generator 310 includes a carbon dioxide (CO2) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the collector mirror 110. The collector 110 has a reflection surface that reflects and focuses the EUV radiation for the lithography exposing processes. In some embodiments, a droplet catcher 120 is installed opposite the target droplet generator 115. The droplet catcher 120 is used for catching excess target droplets. For example, some target droplets may be purposely missed by the laser pulses.

The collector 110 includes a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes multiple layers (such as a plurality of Mo/Si film pairs) and may further include a capping layer (such as Ru) coated on the multiple layers to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern in some embodiments.

In such an EUV radiation source apparatus, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure tool 200.

As shown in FIG. 1A, in some embodiments, a buffer gas is supplied from a first buffer gas supply 130 through the aperture in collector 110 by which the pulse laser is delivered to the tin droplets. In some embodiments, the buffer gas is H2, He, Ar, N2, or another inert gas. In certain embodiments, H2 is used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the collector 110 reacts chemically with a metal of the droplet forming a hydride, e.g., metal hydride. When tin (Sn) is used as the droplet, stannane (SnH4), which is a gaseous byproduct of the EUV generation process, is formed. The gaseous SnH4 is then pumped out through the outlet 140. However, it is difficult to exhaust all gaseous SnH4 from the chamber and to prevent the SnH4 from entering the exposure tool 200.

To trap the SnH4 or other debris, one or more debris collection mechanisms or devices 150 are employed in the chamber 105. As shown in FIG. 1A, one or more debris collection mechanisms or devices 150 are disposed along optical axis A1 between the zone of excitation ZE and an output port 160 of the EUV radiation source 100.

Figure 2:
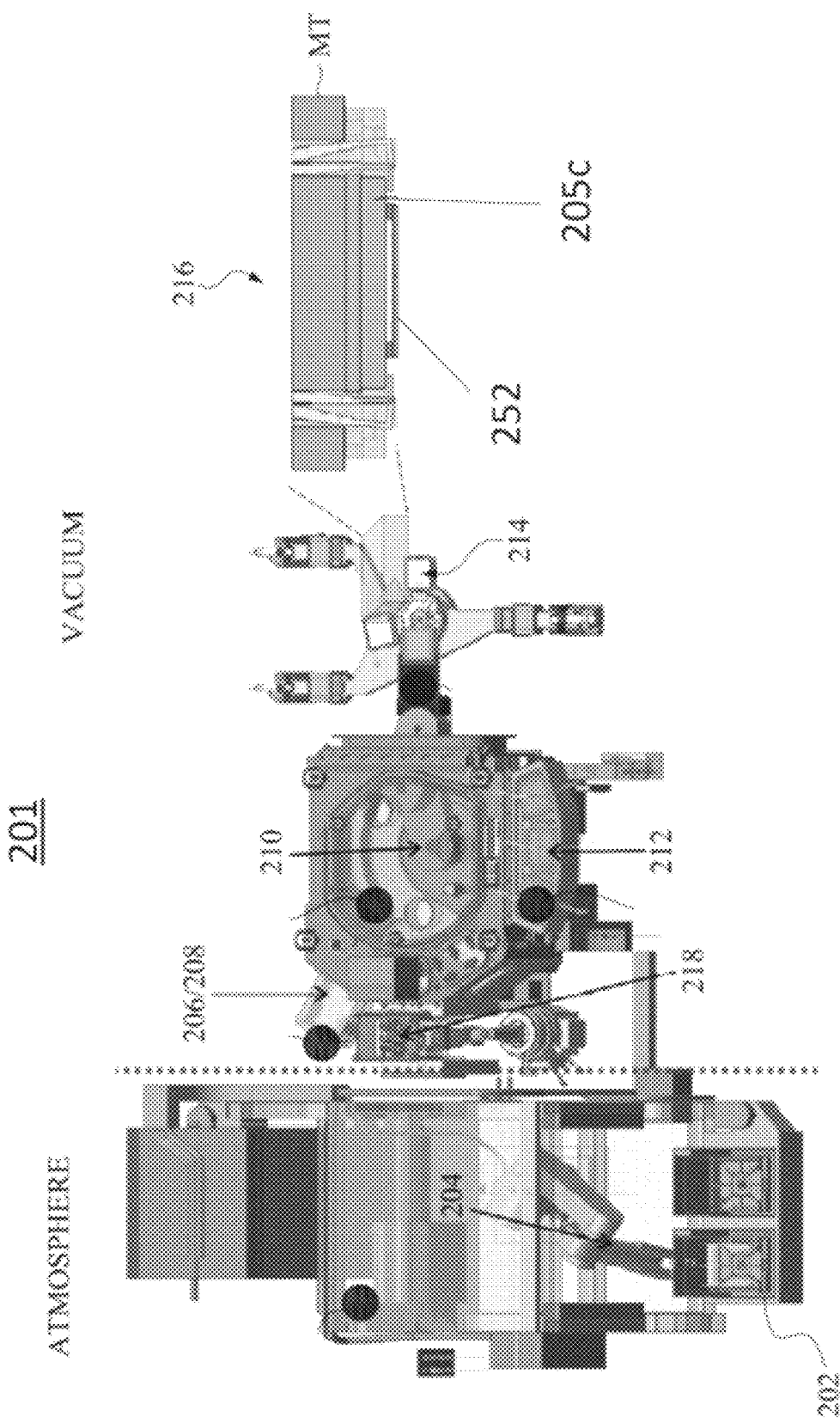
FIG. 2 illustrates a top view of an exemplary layout of different stages (or stations) with an extreme ultraviolet lithography system.

FIG. 2 illustrates a layout of different stages (or stations) of a reticle handling system 201, according to embodiments. In some embodiments, the reticle handling system 201 is used in an extreme ultraviolet (EUV) lithography system. The reticle handling system 201 is used in conjunction with the exposure tool 200 for receiving and storing reticles 205c that are then provided to the exposure tool 200 for exposing to a beam of EUV radiation. As illustrated, the reticle handling system 201 includes a load port 202, an out of vacuum robot (OVR) 204, a reticle backside inspection (RBI) stage 206, a barcode reader 208, an in-vacuum robot (IVR) 210, an in-vacuum library (IVL) 212, a rapid exchange device (RED) 214, and a reticle stage (RS) 216 (e.g., including the reticle 205c). The load port 202 and the out of vacuum robot (OVR) 204 are located in an atmospheric pressure environment while the reticle backside inspection (RBI) stage 206, the barcode reader 208, the in-vacuum robot (IVR) 210, the in-vacuum library (IVL) 212, the rapid exchange device (RED) 214, and the reticle stage (RS) 216 are located in a vacuum environment. Access between the vacuum environment and the atmospheric pressure environment is controlled by a load lock chamber 218. For instance, the load lock chamber 218 is located between the out of vacuum robot (OVR) 204 and the in-vacuum library (IVL) 212.

The load port 202 serves as an entry point to the reticle handling system 201 via which a reticle (e.g., reticle 205c in FIG. 1) is introduced into the reticle handling system 201. In an embodiment, the reticle 205c including the pellicle 252 is enclosed within a clean filter pod (CFP) which in turn is enclosed in a reticle carrier, also known as a reticle standard manufacturing interface ("SMIF") pod, or RSP. The reticle standard manufacturing interface pod permits handling and transportation of the reticle 205c outside of the reticle handling system 201, for example, in an ambient environment. The reticle standard manufacturing interface pod is shaped and sized (or otherwise configured) to be received into the load port 202.

In some embodiments, adjacent to the load port 202 is a RSP library. In some embodiments, reticle standard manufacturing interface pod is placed by load port 202 into RSP library. The RSP library is a repository or storage for multiple reticle standard manufacturing interface pods each including a reticle. When a particular reticle is required, the reticle standard manufacturing interface pod containing the required reticle is retrieved from the RSP library.

In some embodiments, the out of vacuum robot (OVR) 204 retrieves the reticle standard manufacturing interface pod containing the required reticle for providing the reticle to the load lock chamber 218. In some embodiments, the out of vacuum robot (OVR) 204 is also configured to open the reticle standard manufacturing interface pod and remove the clean filter pod including the reticle. A vacuum pump is connected to load lock chamber 218 and forms a vacuum environment inside load lock chamber 218. The load lock chamber 218 is sandwiched by two valves for controlling the pressure in the load lock chamber 218 The load lock chamber 218 provides an interface between the stages of the reticle handling system 201 at atmospheric pressure and the stages of the reticle handling system 201 in vacuum, such that extreme ultraviolet lithography mask can be transferred between atmospheric pressure condition and vacuum condition.

The reticle backside inspection (RBI) stage 206 is located adjacent the load lock chamber 218 and includes the equipment to measure and clean the backside of the reticle 205c to limit the particles on the backside of the reticle 205c. In an embodiment, the reticle backside inspection (RBI) stage 206 includes one or more of an optical system for detecting particles on the backside of the reticle 205c, a measuring system for measuring size of the particles, a cleaning system for cleaning the backside of the reticle 205c, and an inspection system for inspecting the backside of the reticle 205c. The reticle 205c must be kept very flat when attached to chuck. Therefore, it is also important to prevent relatively large particles, (e.g., 1 μm), or layers of smaller particles from migrating to the backside of reticle 205c, which is the surface of the reticle 205c that contacts the chuck. Particles on the backside can distort the reticle 205c and cause focusing and overlay errors. The backside particles can also migrate to the support structure securing the reticle 205c during exposure and cause similar problems for all subsequent reticles that are handled by the support structure. The barcode reader 208 identifies the reticle 205c and the pattern formed thereon.

The in-vacuum robot (IVR) 210 is located adjacent the load lock chamber 218 and operates to transport the reticle 205c (or, as the case may be, the reticle standard manufacturing interface pod including clean filter pod, or the clean filter pod if removed by the out of vacuum robot 204) from the load lock chamber 218 to the in-vacuum library (IVL) 212 for temporarily storing the reticle 205c before use. In some embodiments, when the particular reticle is needed, the in-vacuum robot (IVR) 210 retrieves the desired reticle from the in-vacuum library (IVL) 212 and provides the reticle to the rapid exchange device (RED) 214. In some other embodiments, the rapid exchange device (RED) 214 retrieves the desired reticle from the in-vacuum library (IVL) 212.

During manufacture of integrated circuits using a lithographic apparatus, different reticles are used to generate different circuit patterns to be formed on different layers in the integrated circuit. Thus, during the manufacturing different layers of the integrated circuit the different reticles must be changed. The rapid exchange device (RED) 214 (also referred to as a reticle exchange device) is used to change reticles during the lithography process in the least possible amount of time.

The reticle stage 216 includes a support structure, which, for example, is a chuck, for securing the reticle 205c in place during the lithography process. The pellicle 252 is positioned over the reticle 205c to protect the reticle 205c from particles, dust, damage and/or contamination.

Figure 3:
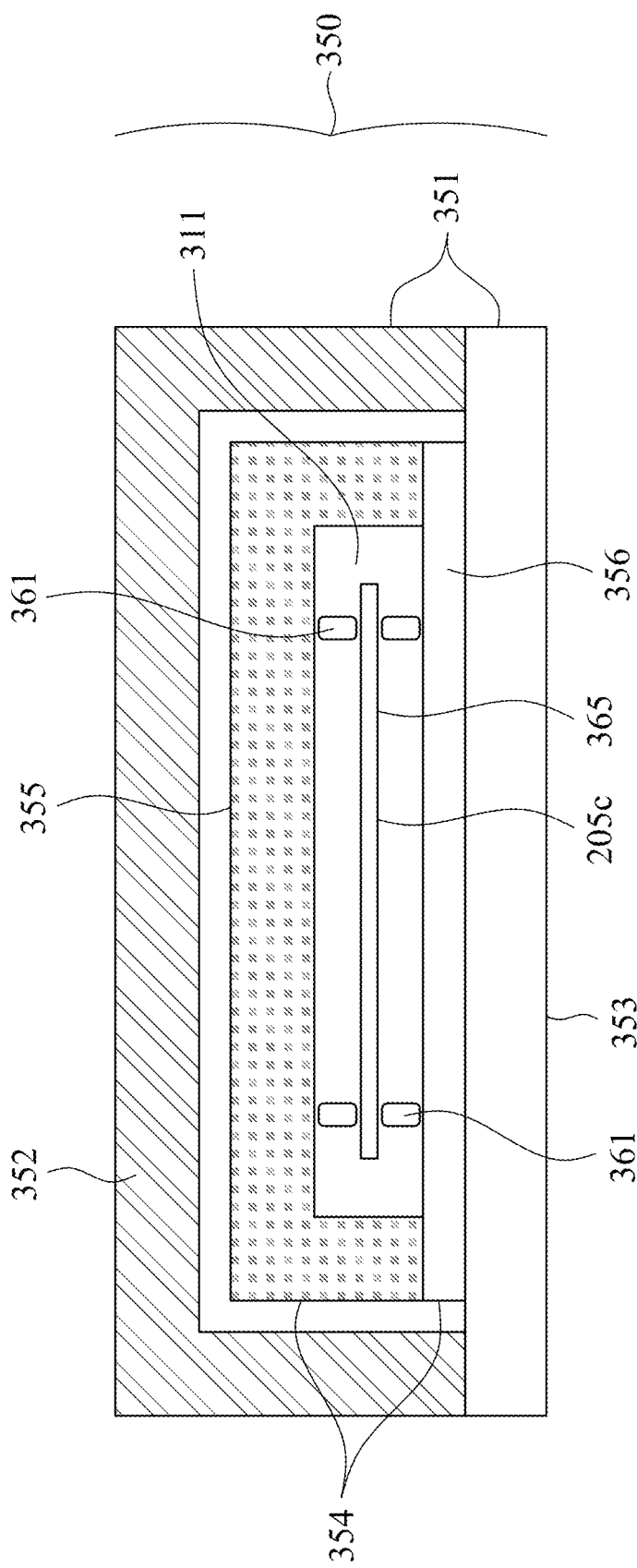
FIG. 3 is a schematic cross-sectional diagram illustrating an EUV reticle pod.

FIG. 3 is a schematic diagram illustrating a reticle pod 350. A reticle is stored, transported, and loaded into a lithography system by the reticle pod 350. The reticle pod 350 is a container including two pods, one inside the other, which protect protection the reticle from contamination. The reticle pod 350 has an outer pod that encases an inner pod. The inner pod holds the reticle directly. The dual pod including the reticle is provided to the reticle handling system 201 (FIG. 2). When received, the reticle handling system 201 initially opens the outer pod to retrieve the inner pod including the reticle. The inner pod containing the reticle is temporarily stored until the reticle is required for use.

As illustrated, the reticle 205c is stored in an inner pod 354. The inner pod 354 includes an inner base 356 and an inner cover 355. The reticle 205c is stored face down in the inner pod 354. More specifically, the printed or patterned surface 365 (also referred to as the front face) of reticle 205c faces the inner base 356 and the backside of reticle 205c faces the inner cover 355. For the sake of clarity of illustration, the pellicle is not shown installed on the patterned surface 365. However, it should be noted that a pellicle (e.g., pellicle 252) is installed on the reticle 205c within the one or more restraining mechanisms 361. The inner base 356 includes one or more restraining mechanisms 361 to reduce sliding or movement of the reticle 205c. Alternatively, or additionally, the inner cover 355 includes one or more restraining mechanisms 361 to secure the reticle 205c in place. By way of example, restraining mechanisms 361 include a clamp, a groove, a pin, a fixation block, and a spring. The inner cover 355 couples to the inner base 356 to define an internal space 311. The reticle 205c is located in the internal space 311 between the inner base 356 and inner cover 355. In an embodiment, there is no metallic contact between inner cover 355 and inner base 356.

The inner pod 354 is securely contained in an outer pod 351. In some embodiments, the outer pod is a reticle standard manufacturing interface ("SMIF") pod (RSP). The outer pod 351 includes an outer base 353 and an outer cover 352. Similar to the inner cover 355 and the inner base 356, the outer base 353 couples to the outer cover 352, effectively sandwiching the inner pod 354 between the outer base 353 and the outer cover 352. The inner pod 354 rests securely on the outer base 353 with the outer cover 352 closed with outer base 353.

The inner and outer pods 354, 351 are designed in a manner that facilitates their opening, closing, and general manipulation. For example, the inner and outer pods 354, 351 are designed to include robotic handling flanges, latch-pin holes, pins, conveyor rails, end effector exclusion volumes, secondary and primary side robotic handling flanges, features for reticle alignment and data matrix identification, registration pin features, features which mate with kinematic-coupling pins, and the like.

FIG. 4A is a plan view of the inner pod 354 in FIG. 3 including the reticle 205c, according to embodiments. FIG. 4B is a cross-sectional view of the inner pod 354 in FIG. 4A. For the sake of clarity of illustration, the pellicle is not shown installed on the patterned surface 365. As illustrated, a plurality of walls or barriers 371a, 371b, 371c, and 371d (collectively, barriers 371) are arranged about (or surrounding) the reticle 205c and the restraining mechanisms 361. Although four barriers 371 are illustrated, the number of barriers 371 can be decreased or increased. For the sake of explanation, the restraining mechanisms 361 are pins or column like structures that extend (Z-direction) from the inner surfaces 381, 383 of the inner cover 355 and the inner base 356, respectively, for securing the reticle 205c therebetween. Four restraining mechanisms 361 are illustrated and are arranged in a 2×2 matrix configuration. However, more than four pins can be arranged in a desired manner. For the sake of clarity of illustration, the barriers 371 are not indicated as hidden structures (shown by dashed lines) in the plan view in FIG. 4A. In some embodiments, one set of the restraining mechanisms 361 on the bottom side or the front side hold the corners of the reticle 205c.

The plurality of barriers 371 are arranged in a concentric manner spaced from each other with alternating barriers 371 being disposed on the inner cover 355 and inner base 356. For example, barrier 371a is the outermost barrier while the barrier 371d is the innermost barrier. The barriers 371a and 371c are disposed on the inner surface 381 of the inner base 356, and the barriers 371b and 371d are disposed on the inner surface 383 of the inner cover 355. The barriers 371a and 371c contact the inner surface 381 and extend (or protrude) therefrom a certain distance (Z-direction) towards the inner surface 383. However, the barriers 371a and 371c do not contact the inner surface 383 and a gap 385 is defined between the barriers 371a and 371c and the inner surface 383. The barriers 371b and 371d contact the inner surface 383 and extend (or protrude) therefrom a certain distance towards the inner surface 381. However, the barriers 371b and 371d do not contact the inner surface 381 and a gap 385 is defined between the barriers 371b and 371d and the inner surface 381. As illustrated, the barriers 371 are not present beyond the inner base 356 in the X-direction. A space between adjacent barriers is in a range from 1 mm to 100 mm in some embodiments. In embodiments, the distance (Z-direction) the barriers extend is in a range from 50 mm to 300 mm. In some embodiments, the barriers are composed of materials including metal or plastic.

The barriers 371 limit passage of contaminants between the internal space 311 and an external environment of the inner pod 354. As seen in FIG. 4A, the alternating barriers 371 interlock, and the gaps (spaces) 387 between adjacent barriers 371 and the gaps 385 between the barriers 371 and the inner surfaces 381, 383 form a tortuous path 375 that creates an impediment for external particles traveling into the inner pod 354 and limit exposure of the reticle 205c to these particles. Similarly, the tortuous path 375 creates an impediment for particles generated inside the inner pod 354 and limit exit of the particles from the inner pod 354. The barriers 371 thus limit contamination of the reticle 205c and the exposure tool 200.

Figure 5A:
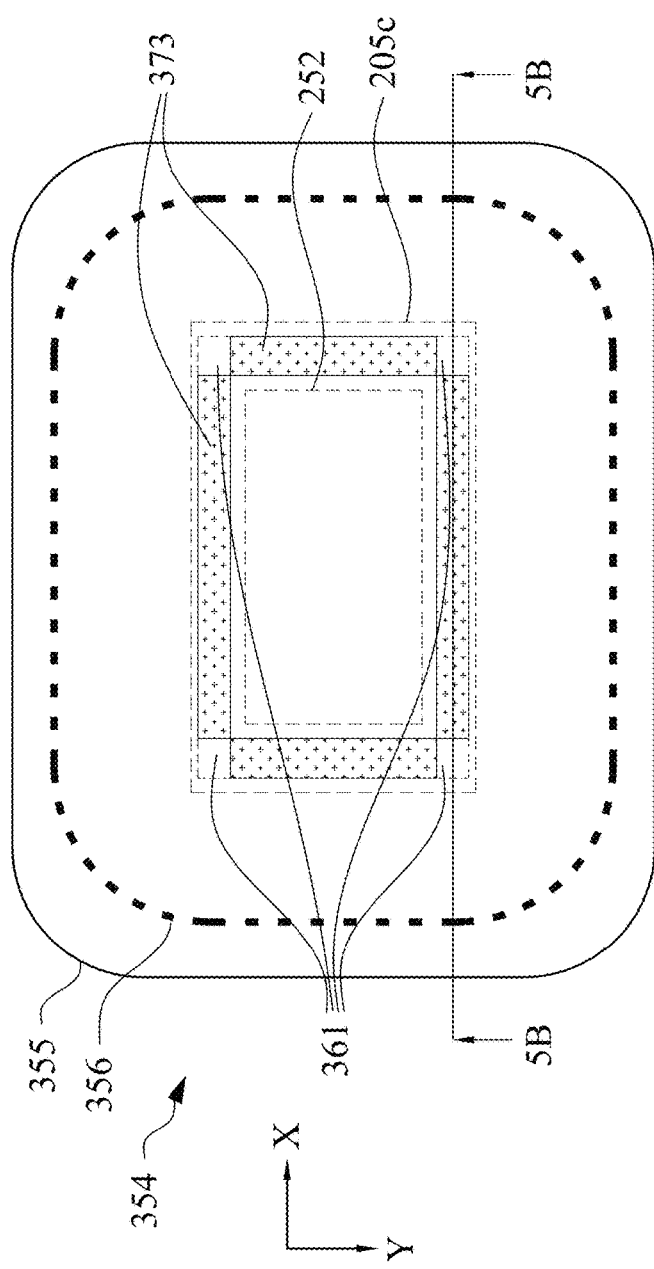
FIG. 5A is a plan view of the EUV Inner Pod (EIP) in FIG. 3 including the reticle, according to embodiments.
Figure 5B:
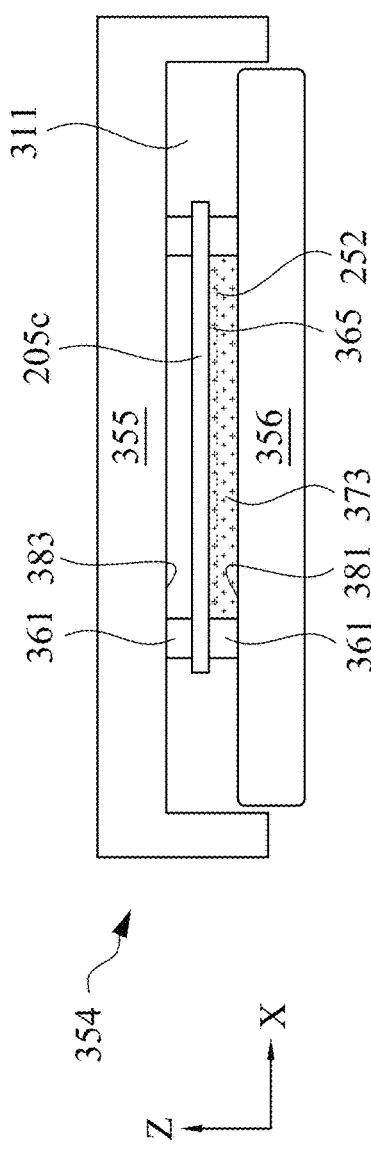
FIG. 5B is a cross-sectional view of the EUV Inner Pod (EIP) in FIG. 5A

FIG. 5A is a plan view of the inner pod 354 in FIG. 3 including the reticle 205c, according to embodiments. FIG. 5B is a cross-sectional view of the inner pod 354 in FIG. 5A. The inner pod 354 in FIGS. 5A and 5B includes wall structures 373 disposed on the inner base 356 and extending between each restraining mechanism 361. For the sake of explanation, the restraining mechanisms 361 are pins or column like structures that extend from the inner surfaces 381, 383 of the inner cover 355 and the inner base 356, respectively, for securing the reticle 205c therebetween. Although the wall structures 373 are hidden in view in the plan view in FIG. 5A, for the sake of clarity of illustration, the wall structures 373 are shown by solid lines (instead of dashed lines). As illustrated, the pellicle 252 is located entirely within the wall structures 373 and the reticle 205c (or at least one or more edges thereof) extends beyond the wall structures 373.

In some embodiments, and as illustrated in FIG. 5B, the wall structures 373 are only present between restraining mechanisms 361 on the inner base 356. In some embodiments, the height (Z-direction) of the wall structures 373 is substantially equal to that of the restraining mechanisms 361 and thus the wall structures 373 contact the patterned surface 365 of the reticle 205c. In other embodiments, the height of the wall structures 373 is smaller than that of the restraining mechanisms 361 and thus a space or a gap is formed between the wall structures 373 and the patterned surface 365 of the reticle 205c. In such instances, a padding (e.g., a padding 377 discussed elsewhere in this document) is disposed in the gap. However, in other instances, the gap is unfilled.

In other embodiments, the wall structures 373 are only present between restraining mechanisms 361 on the inner cover 355. In still other embodiments, the wall structures 373 are present between restraining mechanisms 361 on both the inner base 356 and the inner cover 355. In some embodiments, the wall structures 373 are composed of metal or plastic.

The wall structures 373 create an impediment for external particles traveling into the inner pod 354 and limit exposure of the reticle 205c to these particles. Similarly, the wall structures 373 create an impediment for particles generated inside the inner pod 354 and limit exit of the particles from the inner pod 354. The wall structures 373 thus limit contamination of the reticle 205c and the exposure tool 200.

Figure 6A:
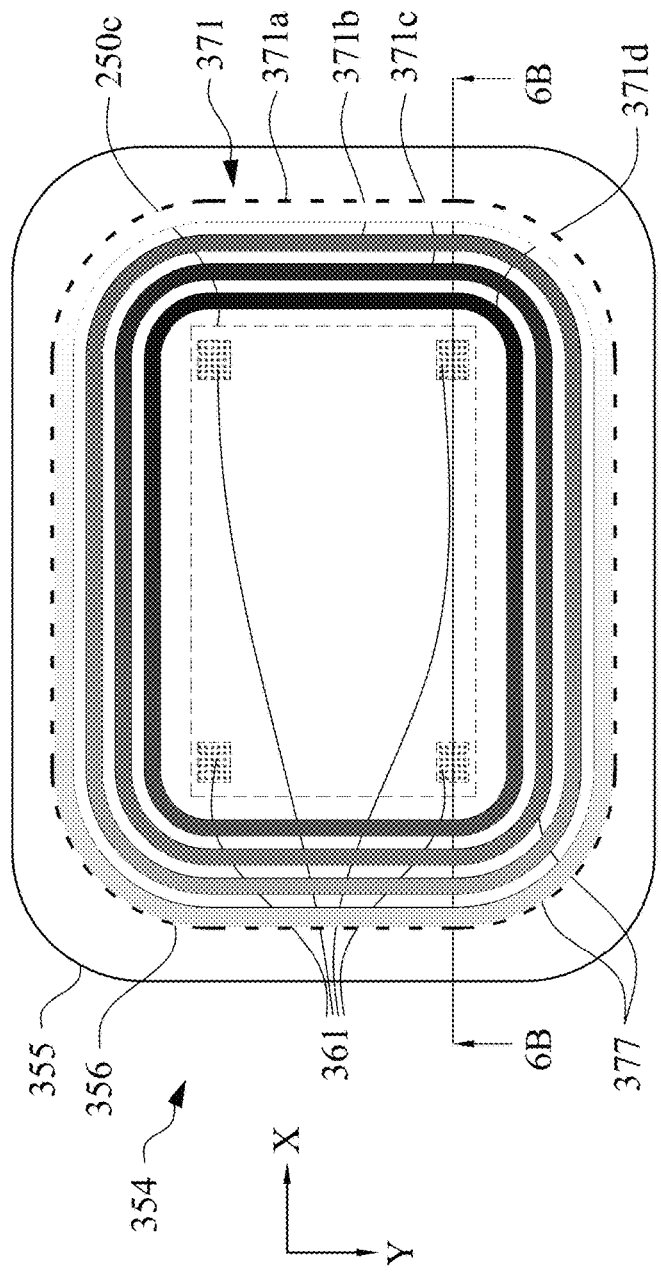
FIG. 6A is a plan view of the EUV Inner Pod (EIP) in FIG. 3 including the reticle.
Figure 6B:
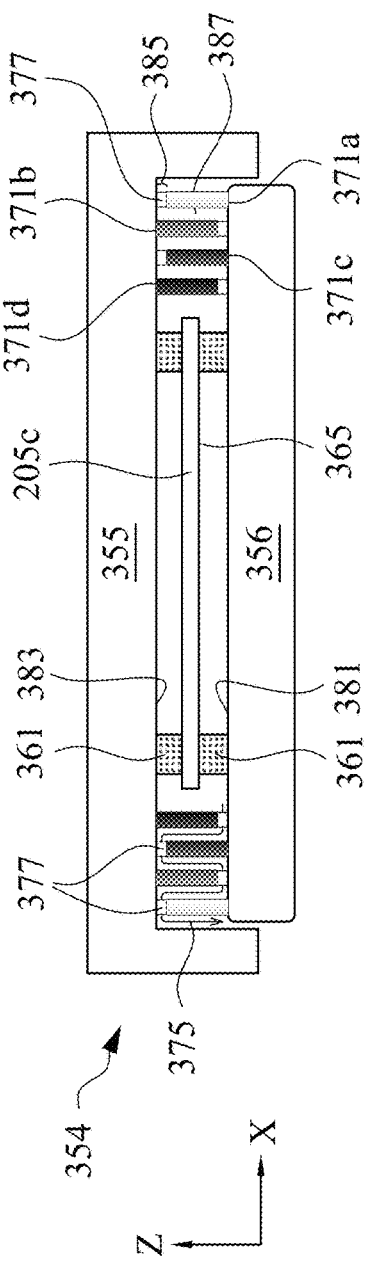
FIG. 6B is a cross-sectional view of the EUV Inner Pod (EIP) in FIG. 6A.

FIG. 6A is a plan view of the inner pod 354 in FIG. 3 including the reticle 205c, according to embodiments. FIG. 6B is a cross-sectional view of the inner pod 354 in FIG. 6A. For the sake of clarity of illustration, the pellicle is not shown installed on the patterned surface 365. The structure of the inner pod 354 in FIGS. 6A and 6B is similar to the structure in FIGS. 4A and 4B. In addition, in FIGS. 6A and 6B, the inner pod 354 includes a padding 377 (also referred to as an absorber) made of a soft or compliant (elastic) material positioned in the gaps 385 between each individual barrier 371 and the adjacent inner surface 381, 383. In some embodiments, the paddings 377 are softer (more elastic) than barriers 371. Stated otherwise the barriers 371 are stiffer than the paddings 377. In some embodiments, the padding 377 has a reduced tack (or stickiness) such that the padding 377 is limited from sticking to the inner surfaces 381, 383. A reduced tack also limits the residue that is left on the inner surfaces 381, 383 when the inner cover 355 and inner base 356 are separated from each other. For example, as illustrated, the gap 385 between each barrier 371a and 371c and the inner surface 383 includes the padding 377. Similarly, the gap 385 between each barrier 371b and 371d and the inner surface 381 includes the padding 377. In some embodiments, a padding 377 is present in at least one of the gaps 385 between the barriers 371 and the inner surfaces 381, 383, and some of the other gaps 385 may not include the paddings 377. The paddings 377 are slightly thicker (Z-direction) than the height of the gap 385, and since the paddings 377 are compliant, the padding 377 gets compressed and occupy the entire gap 385 when the inner cover 355 is coupled to the inner base 356.

The paddings 377 provide another impediment in addition to the tortuous path 375 for external particles traveling into the inner pod 354 and limit exposure of the reticle 205c to these particles. Similarly, the paddings 377 and the tortuous path 375 create an impediment for particles generated inside the inner pod 354 and thereby limit the exit of such particles from the inner pod 354.

In some other embodiments, the inner pod 354 includes a combination of two or more of the barriers 371, the wall structures 373, and the paddings 377. For instance, the inner pod 354 in FIGS. 6A and 6B includes the wall structures 373 in addition to the barriers 371 and the paddings 377. Similarly, the inner pod 354 in FIGS. 5A and 5B includes the barriers 371 in addition to the wall structures 373.

Figure 7:
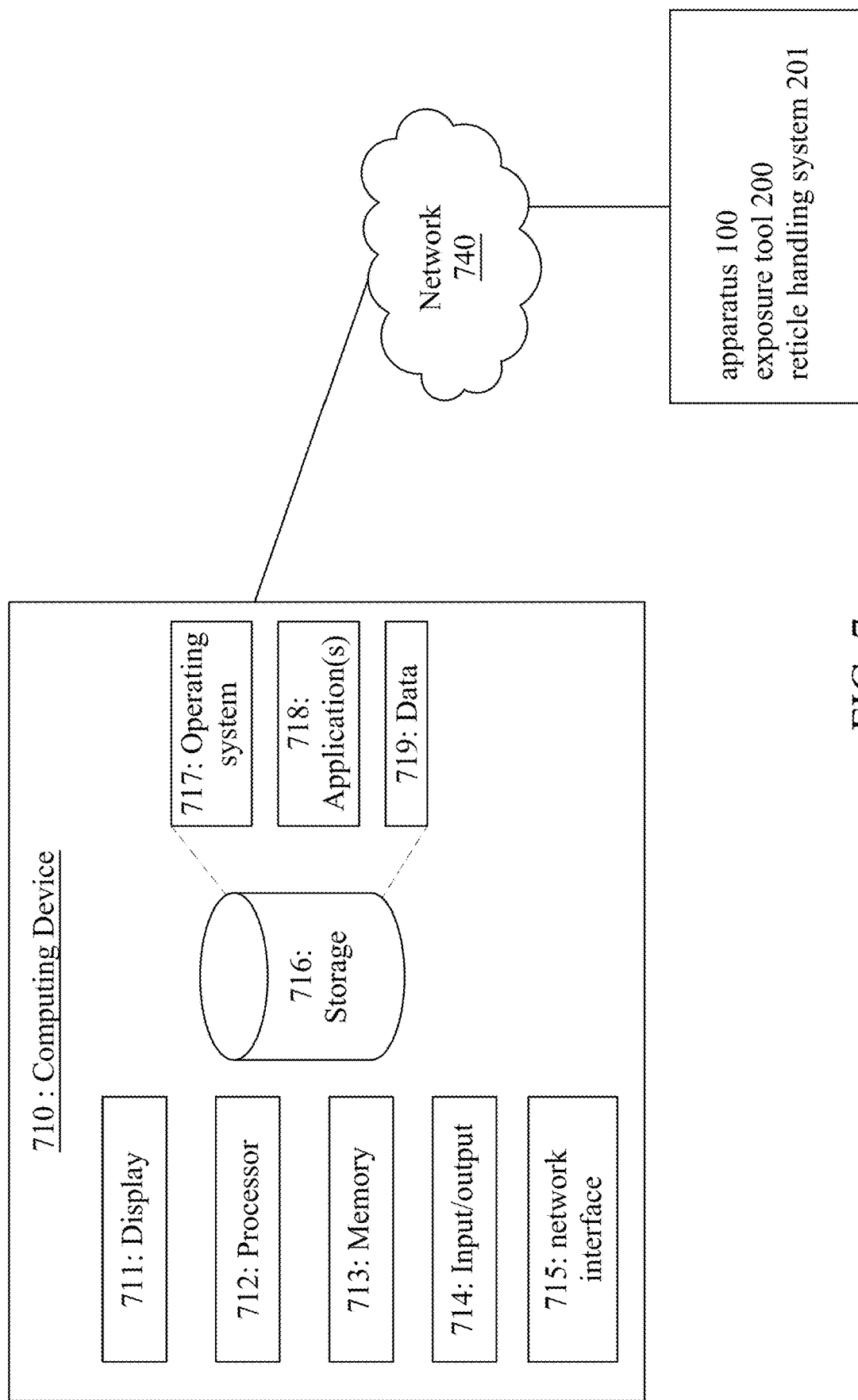
FIG. 7 is a block diagram illustrating an example computing device for controlling an operation of the EUV radiation source apparatus, the exposure tool, and/or the reticle handling system illustrated in FIGS. 1A, 1B, and 2, according to some embodiments.

FIG. 7 is a block diagram illustrating an example computing device 710 for controlling an operation of the radiation source apparatus 100, the exposure tool 200, and/or the reticle handling system 201 illustrated in FIGS. 1A, 1B, and FIG. 2, according to some embodiments. In some embodiments, the computing device 710 is implemented using hardware or a combination of software and hardware, either in a dedicated server, integrated into another entity, or distributed across multiple entities.

The computing device 710 is communicable connected to the EUV radiation source apparatus 100, the exposure tool 200, and/or the reticle handling system 201 using a wireless or wired network 740 to permit data exchange therebetween.

The computing device 710 includes a display 711, a processor 712, a memory 713, an input/output interface 714, a network interface 715, and a storage 716 storing an operating system 717, programs or applications 718 such as application for controlling the EUV radiation source apparatus 100, the exposure tool 200, and/or the reticle handling system 201. The processor 712 can be a general-purpose microprocessor, a microcontroller, a Digital Signal Processor (DSP), an Application Specific Integrated Circuit (ASIC), a Field-Programmable Gate Array (FPGA), a Programmable Logic Device (PLD), a controller, a state machine, gated logic, discrete hardware components, or any other suitable entity that can perform calculations or other manipulations of information. The storage 716 can be a Random Access Memory (RAM), a flash memory, a Read-Only Memory (ROM), a Programmable Read-Only Memory (PROM), an Erasable PROM (EPROM), registers, a hard disk, a removable disk, a CD-ROM, a DVD, or any other suitable storage device, for storing information and instructions to be executed by processor 710. The processor 710 and storage 716 can be supplemented by, or incorporated in, special purpose logic circuitry.

The network interface 715 includes networking interface cards, such as Ethernet cards and modems. In some embodiments, the input/output interface 714 is configured to connect to a plurality of devices, such as an input device and/or an output device. Example input devices include a keyboard and a pointing device, e.g., a mouse or a trackball, by which a user can provide input to the computing device 710. Other kinds of input devices are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices include display devices, such as an LED (light emitting diode), CRT (cathode ray tube), or LCD (liquid crystal display) screen, for displaying information to the user.

The applications 718 can include instructions which, when executed by the computing device 710 (or the processor 712 thereof), causes the computing device 710 (or the processor 712 thereof) to control the EUV radiation source apparatus 100, the exposure tool 200, and/or the reticle handling system 201, and perform other operations, methods, and/or processes that are explicitly or implicitly described in the present disclosure.

The data 719 can include data including default parameters used in the control operations, data that is received, for example, through the input/output interface 714 or through the network interface 715 transmitted from the EUV radiation source apparatus 100, the exposure tool 200, and/or the reticle handling system 201, data for displaying on the display 711, data that is transmitted to or from the EUV radiation source apparatus 100, the exposure tool 200, and/or the reticle handling system 201 via the network 740, or data generated during operation of the computing device 710.

Embodiments of the present disclosure are directed to reducing passage of contaminants into an inner pod and thereby limit contamination of the reticle contained therein. Embodiments of the present disclosure are directed to limiting particles generated inside the inner pod from exiting the inner pod, and thereby limit contamination of the exposure tool 200, and/or the reticle handling system 201.

It will be understood that not all advantages have been necessarily discussed herein, no particular advantage is required for all embodiments or examples, and other embodiments or examples may offer different advantages.

According to some embodiments of the present disclosure, a reticle enclosure includes a base having including a first surface and a cover having including a second surface and coupled to the base with the first surface facing the second surface. The base and the cover form an internal space therebetween that includes a reticle. The reticle enclosure further includes a plurality of restraining mechanisms arranged in the internal space and securing the reticle in position in the internal space, and at least two barriers spaced from each other, concentrically arranged in the internal space, and at least partially surrounding the reticle. The at least two barriers are configured to limit passage of contaminants between the internal space and an external environment of the reticle enclosure. In an embodiment, a first barrier of the at least two barriers contacts the first surface and extends from the first surface to the second surface and a first gap is defined between the first barrier and the second surface, and a second barrier of the at least two barriers contacts the second surface and extends from the second surface to the first surface and a second gap is defined between the second barrier and the first surface. In an embodiment, the first barrier and the second barrier define a tortuous path between the base and the cover, and wherein the tortuous path limits contaminants from entering the internal space from the external environment and limits particles within the internal space from exiting the reticle enclosure. In an embodiment, a padding is disposed in at least one of the first gap and the second gap. In an embodiment, the padding includes an elastic material. In an embodiment, a thickness of the padding is greater than a height of the at least one of the first gap and the second gap. In an embodiment, the first barrier and the second barrier are stiffer than the padding. In an embodiment, the particles within the internal space comprise pellicle particles generated due to breakage of a pellicle installed on the reticle.

According to some embodiments of the present disclosure, a reticle enclosure includes a base having a first surface, a cover having a second surface and coupled to the base with the first surface facing the second surface. The base and the cover form an internal space therebetween that includes a reticle. The reticle enclosure also includes a plurality of restraining mechanisms arranged in the internal space and securing the reticle in position in the internal space, and wall structures extending between and contacting the plurality of restraining mechanisms. The wall structures are arranged in the internal space and at least partially enclose the reticle. In an embodiment, the wall structures are disposed on the base and contact the first surface. In an embodiment, the wall structures are disposed on the cover and contact the second surface. In an embodiment, the wall structures are disposed on the base and the cover and contact the first surface and the second surface. In an embodiment, a height of the wall structures is substantially equal to that of the plurality of restraining mechanisms and the wall structures contact the reticle. In an embodiment, a height of the wall structures is smaller than that of the plurality of restraining mechanisms and a gap is formed between the wall structures and the reticle.

According to some embodiments of the present disclosure, a lithography system includes an exposure chamber, a reticle stage arranged within the exposure chamber, and a reticle library including at least one reticle enclosure. The reticle enclosure includes a reticle intended for the reticle stage. The at least one reticle enclosure encloses an inner reticle enclosure that contains the reticle. The inner reticle enclosure includes an inner base, an inner cover coupled to the inner base and forming an internal space therebetween, the reticle being positioned in the internal space, a plurality of restraining mechanisms arranged in the internal space and securing the reticle in position, and a plurality of barriers disposed in the internal space and surrounding the reticle. The plurality of barriers, the inner base and the inner cover define a tortuous path configured to limit passage of particles between the internal space and an external environment of the inner reticle enclosure. In an embodiment, the plurality of barriers are arranged in a concentric manner spaced from each other with alternating barriers being disposed on the inner cover and inner base. In an embodiment, alternating barriers of the plurality of barriers are spaced from the inner cover and the inner base, thereby defining gaps between the plurality of barriers and the inner cover and the inner base. In an embodiment, a padding is disposed in one or more gaps. In an embodiment, the padding includes an elastic material. In an embodiment, when secured in position, the reticle is separated from the inner base and inner cover.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reticle pod, comprising:
   an inner pod including an inner base having a first surface, and an inner cover having a second surface and positioned on the inner base with the first surface contacting the second surface, wherein the inner base and the inner cover define a first internal space therebetween;
   a plurality of first barriers contacting the first surface and extending between the first surface and second surface; and
   a plurality of second barriers contacting the second surface and extending between the first surface and the second surface, the plurality of first barriers and the plurality of second barriers being alternatively arranged in an interlocking pattern about the first internal space.

2. The reticle pod of claim 1, wherein a reticle is secured in the first internal space and the plurality of first barriers and the plurality of second barriers concentrically surround the reticle.

3. The reticle pod of claim 2, further comprising:
   a plurality of restraining mechanisms arranged in the first internal space and securing the reticle in position in the first internal space.

4. The reticle pod of claim 1, wherein
   first gaps are defined between the plurality of first barriers and the second surface, and
   second gaps are defined between the plurality of second barriers and the first surface.

5. The reticle pod of claim 4, wherein the plurality of first barriers and the plurality of second barriers define a tortuous path between the inner base and the inner cover, and wherein the tortuous path limits contaminants from entering the first internal space from an external environment and limits particles within the first internal space from exiting the reticle pod.

6. The reticle pod of claim 4, wherein a padding is disposed in at least one of the first gaps and the second gaps.

7. The reticle pod of claim 6, wherein a thickness of the padding is greater than a height of the at least one of the first gaps and the second gaps.

8. The reticle pod of claim 6, wherein the plurality of first barriers and the plurality of second barriers are stiffer than the padding.

9. The reticle pod of claim 1, wherein a space between the first barriers and the second barriers is in a range from 1 mm to 100 mm.

10. The reticle pod of claim 1, wherein a distance the first barriers and the second barriers extend is in a range from 50 mm to 300 mm.

11. A reticle pod, comprising:
an inner pod including an inner base having a first surface, and an inner cover having a second surface and positioned on the inner base with the first surface contacting the second surface, wherein the inner base and the inner cover define a first internal space therebetween;
a plurality of first barriers contacting the first surface and extending between the first surface and second surface;
a plurality of second barriers contacting the second surface and extending between the first surface and the second surface, the plurality of first barriers and the plurality of second barriers being alternatively arranged in an interlocking pattern about the first internal space; and
a plurality of wall structures arranged along a periphery of the first internal space, each wall structure extending between the inner base and the inner cover.

12. The reticle pod of claim 11, wherein a reticle is arranged in the first internal space and the plurality of wall structures surround the reticle.

13. The reticle pod of claim 11, wherein the plurality of wall structures are disposed on the inner base and contact the first surface.

14. The reticle pod of claim 11, wherein the plurality of wall structures are disposed on the inner cover and contact the second surface.

15. The reticle pod of claim 11, wherein the plurality of wall structures are disposed on the inner base and the inner cover and contact the first surface and the second surface.

16. The reticle pod of claim 11, wherein the plurality of wall structures contact a reticle located in the first internal space.

17. The reticle pod of claim 11, wherein a gap is formed between the plurality of wall structures and a reticle located in the first internal space.

18. The reticle pod of claim 11, further comprising a plurality of restraining mechanisms arranged in the first internal space, the plurality of restraining mechanisms securing a reticle located in the first internal space.

19. A lithography system, comprising:
an exposure chamber;
a reticle stage arranged within the exposure chamber; and
a reticle library including at least one reticle enclosure, the at least one reticle enclosure including a reticle intended for the reticle stage, wherein the at least one reticle enclosure encloses a reticle enclosure that contains the reticle, the reticle enclosure including:
a pod including a base having a first surface, and a cover having a second surface and positioned on the base with the first surface contacting the second surface, wherein the base and the cover define an internal space therebetween;
a plurality of first barriers contacting the first surface and extending between the first surface and second surface; and
a plurality of second barriers contacting the second surface and extending between the first surface and the second surface, the plurality of first barriers and the plurality of second barriers being alternatively arranged in an interlocking pattern about the internal space.

20. The lithography system of claim 19, further comprising:
a plurality of wall structures arranged in the internal space and about the reticle, each wall structure arranged between two restraining members arranged in the internal space, wherein
the two restraining members and the plurality of wall structures secure the reticle, and
the plurality of wall structures and the plurality of the first barriers and second barriers define a tortuous path that is configured to limit passage of particles between the internal space and an external environment of the reticle enclosure.

* * * * *